United States Patent
Cheshire

(10) Patent No.: US 8,298,959 B2
(45) Date of Patent: Oct. 30, 2012

(54) METHOD AND APPARATUS FOR ETCHING

(75) Inventor: Alan Cheshire, Glasgow (GB)

(73) Assignee: Applied Materials, Inc., Santa Clara, CA (US)

( * ) Notice: Subject to any disclaimer, the term of this patent is extended or adjusted under 35 U.S.C. 154(b) by 215 days.

(21) Appl. No.: 12/786,006

(22) Filed: May 24, 2010

(65) Prior Publication Data

US 2010/0308014 A1 Dec. 9, 2010

Related U.S. Application Data

(60) Provisional application No. 61/183,604, filed on Jun. 3, 2009.

(51) Int. Cl.
*H01L 21/302* (2006.01)

(52) U.S. Cl. ........... 438/719; 438/706; 438/714; 216/79

(58) Field of Classification Search .............. 438/9, 706, 438/710, 712, 714, 719, 723, 740; 216/58, 216/67, 79
See application file for complete search history.

(56) References Cited

U.S. PATENT DOCUMENTS

| | | | | |
|---|---|---|---|---|
| 5,380,677 A | * | 1/1995 | Eakin ............................ | 438/365 |
| 5,705,025 A | * | 1/1998 | Dietrich et al. ................. | 438/29 |
| 7,491,343 B2 | * | 2/2009 | Adams et al. ................... | 216/37 |
| 2009/0286400 A1 | * | 11/2009 | Heo et al. ...................... | 438/694 |

FOREIGN PATENT DOCUMENTS

| | | |
|---|---|---|
| JP | 2008-172184 A | 7/2008 |
| KP | 10-0875653 B1 | 12/2008 |
| KR | 10-0428889 B1 | 4/2004 |
| KR | 2008-0073647 A | 8/2008 |

OTHER PUBLICATIONS

PCT international search report and written opinion of PCT/US2010/035959 dated Jan. 3, 2011.

* cited by examiner

*Primary Examiner* — Lan Vinh
(74) *Attorney, Agent, or Firm* — Patterson & Sheridan, LLP

(57) ABSTRACT

Embodiments of the invention relate to a substrate etching method and apparatus. In one embodiment, a method for etching a substrate in a plasma etch reactor is provided that includes a) depositing a polymer on a substrate in an etch reactor, b) etching the substrate using a gas mixture including a fluorine-containing gas and oxygen in the etch reactor, c) etching a silicon-containing layer the substrate using a fluorine-containing gas without mixing oxygen in the etch reactor, and d) repeating a), b) and c) until an endpoint of a feature etched into the silicon-containing layer is reached.

20 Claims, 3 Drawing Sheets

METHOD AND APPARATUS FOR ETCHING

CROSS-REFERENCE TO RELATED APPLICATIONS

This application claims benefit of U.S. Provisional Patent Application Ser. No. 61/183,604, filed Jun. 3, 2009, which is incorporated by reference in its entirety.

BACKGROUND OF THE INVENTION

1. Field of the Invention

Embodiments of the invention generally relate a method and apparatus for etching, and more particularly, a method and apparatus suitable for etching Micro-Electro-Mechanical Systems (MEMS) devices and the like.

2. Description of the Related Art

The demand for Micro-Electro-Mechanical Systems (MEMS) devices has introduced new challenges for processing equipment companies. One challenge is providing equipment suitable for efficient plasma etching of materials utilized to fabricate MEMS structures. For example, processing equipment utilized for etching must be able to maintain good critical dimension control and mask selectivity in order to successfully manufacture MEMS structures on a commercially viable scale. Additionally for MEMS structures intended for optical devices, the processing equipment must produce sufficiently smooth sidewalls as not to inhibit obtaining performance goals.

Silicon is a material commonly used for MEMS structures. Silicon etching for MEMS fabrication is typically carried out in a reactive ion etch (RIE) reactor. Typical RIE reactors generally have limited small plasma generation areas and limited power capability. This makes it difficult to achieve good etching uniformity in larger substrate formats and also limits the etch rate. Moreover, RIE reactors generally etch faster in the center relative the edge of a substrate, which limits potential product yields and quality.

Some RIE etch reactors employ a cyclical etch process that includes several recipe steps, such as etch and deposition, or etch, flash, and deposition. The cyclical etch process may use a time multiplexed gas modulation ("TMGM") system or a Bosch system to sequentially provide etchants and deposition species. The deposition species provides a protective film upon the previously etched surface to protect the surface, typically the sidewalls of the trench, from further etching. These two steps are repeated as a deeper and deeper trench is formed. Poor control of the cyclical etch process disadvantageously increases the roughness of the sidewalls, which may render a microelectronic device defective.

Therefore, there is a need for an improved method and apparatus of for etching.

SUMMARY OF THE INVENTION

Embodiments of the invention relate to a substrate etching method and apparatus. In one embodiment, a method for etching a substrate in a plasma etch reactor is provided that includes a) depositing a polymer on a substrate in an etch reactor, b) etching the substrate using a gas mixture including a fluorine-containing gas and oxygen in the etch reactor, c) etching a silicon-containing layer disposed on the substrate using a fluorine-containing gas without mixing oxygen in the etch reactor, and d) repeating a), b) and c) until an endpoint of a feature etched into the silicon-containing layer is reached.

In another embodiment, a method for etching a substrate in a plasma etch reactor is provided that includes a) depositing a polymer on a substrate in an etch reactor, b) etching the substrate using a gas mixture including a fluorine-containing gas and oxygen in the etch reactor, the gas mixture additionally including at least one of He or $HeO_2$, c) etching a silicon-containing layer disposed on the substrate using a fluorine-containing gas without mixing oxygen in the etch reactor, and d) repeating a), b) and c) until an endpoint of a feature etched into the silicon-containing layer is reached.

In some embodiments, etching the substrate using a gas mixture including a fluorine-containing gas and oxygen is performed at a lower pressure than etching a silicon-containing layer disposed on the substrate using a fluorine-containing gas without mixing oxygen.

In some embodiments, etching the substrate using a gas mixture including a fluorine-containing gas and oxygen is performed at a higher bias power than etching a silicon-containing layer disposed on the substrate using a fluorine-containing gas without mixing oxygen.

In some embodiments, a purge step is performed between the deposition and etch steps. In additional embodiments, purging includes flowing at least one of He or $HeO_2$ into the etch reactor.

In some embodiments, etching the substrate using a gas mixture including a fluorine-containing gas and oxygen is performed in the presence of a plasma formed from $SF_6$ and $O_2$.

In yet some additional embodiments, etching the substrate using a gas mixture including a fluorine-containing gas and oxygen is performed in the presence of a plasma formed from $SF_6$ and $O_2$ and at least one of He and $HeO_2$, while etching a silicon-containing layer disposed on the substrate using a fluorine-containing gas without mixing oxygen is performed in the presence of a plasma formed from $SF_6$.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
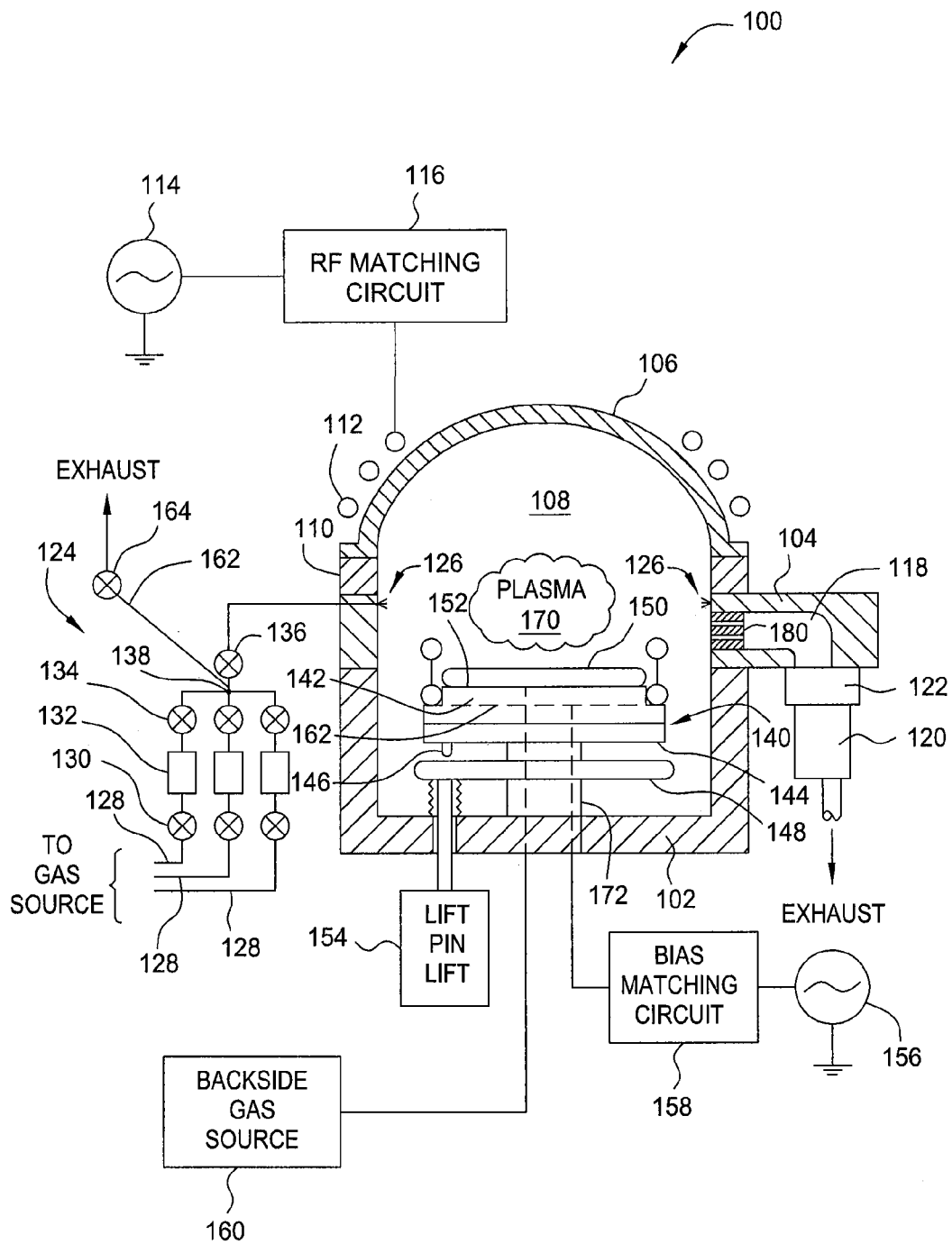
FIG. 1 is a sectional schematic of one embodiment of a substrate etching reactor.

To facilitate understanding, identical reference numerals have been used, where possible, to designate identical elements that are common to the figures. It is to be noted, however, that the appended drawings illustrate only typical embodiments of this invention and are therefore not to be considered limiting of its scope, for the invention may admit to other equally effective embodiments.

DETAILED DESCRIPTION

The invention generally relates to an apparatus and method for etching. Although the apparatus and methods described herein are particularly advantageous for etching silicon for MEMS applications, it is contemplated that the embodiments of the invention are not limited to use with silicon etching, but may be beneficially utilized to etch other types of materials and/or be utilized in other etch reactors. To better understand the novelty of the apparatus of the invention and the methods of use thereof, reference is hereafter made to the accompanying drawings.

FIG. 1 is a sectional view of one embodiment of an etch reactor 100. The etch reactor 100 includes a lower chamber body 102, an upper chamber body 104, and a ceiling 106 which enclose a process volume 108. The ceiling 106 may be flat or have other geometry. In one embodiment, the ceiling 106 is a dome. An interchangeable spacer 110 is provided between the ceiling 106 and the upper chamber body 104 so that the inclination and/or height of the ceiling 106 relative to the upper chamber body 104 may be selectively changed as desired.

An RF coil 112 is disposed above the ceiling 106 and coupled to an RF source 114 through a matching circuit 116. The ceiling 106 is transmissive to the RF power such that source power applied to the coil 112 from the RF source 114 may be inductively coupled to and energize gases disposed in the process volume 108 of the reactor 100 to maintain a plasma 170. Conventionally, the power applied to the coil 112 is known as source power.

The source power may be provided at a radio frequency within a range from about 12 Mhz to about 13.5 MHz at a power within a range from about 10 watts to about 5000 watts. The source power may be pulsed.

The upper chamber body 104 includes a pumping channel 118 that connects the process volume 108 of the reactor 100 to a pump 120 through a throttle valve 122. The pump 120 and throttle valve 122 may be operated to control the pressure within the process volume 108 of the reactor 100. The pump 120 also removes etch by-products. A baffle plate 180 may be disposed in the pumping channel 118 to minimize contamination of the pump 120 and to improve conductance within the process volume 108.

The reactor 100 has a fast gas exchange system 124 coupled thereto that provides process and/or other gases to the process volume 108 through nozzles 126 positioned around the interior of the upper chamber body 104 or other suitable location. The fast gas exchange system 124 selectively allows any singular gas or combination of gases to be provided to the process volume 108. In one embodiment, the fast gas exchange system 124 has three delivery lines 128, each coupled to a different gas source. The delivery lines 128 may be coupled to the same or different nozzles 126.

In the embodiment depicted in FIG. 1, each delivery line 128 includes a first valve 130, a mass flow meter 132, and a second valve 134. The second valves 134 are coupled to a common tee 138, which is coupled to the nozzles 126. The conduits through which gases flow from mass flow meters 132 to the process volume 108 is less than about 2.5 m in length, thereby allowing faster switching times between gases. The fast gas exchange system 124 may be isolated from the process volume 108 of the reactor 100 by an isolation valve 136 disposed between the tee 138 and nozzles 126.

An exhaust conduit 162 is coupled between the isolation valve 136 and the tee 138 to allow residual gases to be purged from the fast gas exchange system 124 without entering the reactor 100. A shut off valve 164 is provided to close the exhaust conduit 162 when gases are delivered to the process volume 108 of the reactor 100.

The gas sources coupled to the fast gas exchange system 124 may provide gases, including but not limited to, sulfur hexafluoride ($SF_6$), oxygen, argon, trifluoromethane ($CHF_3$), $C_4F_8$, $NF_3$, $CF_4$, $CHF_3$, $ClF_3$, $BrF_3$, $IF_3$, $HeO_2$, and/or helium. The flow control valves may include pneumatic operation to allow rapid response. In one example, the fast gas exchange system 124 is operable to deliver $SF_6$ and $C_4F_8$ at up to about 1000 sccm, helium at about 500 sccm, and oxygen ($O_2$) and argon at about 200 sccm. In an alternative embodiment, the fast gas exchange system 124 may further include a third gas panel comprising of a plasma sustaining gas, such as argon and/or He, and operable to continuously deliver the gas to the reactor 100 during the cyclical etching method described further below.

The etch reactor 100 additionally includes a substrate support assembly 140 is disposed in the process volume 108. The substrate support assembly 140 includes an electrostatic chuck 142 mounted on a thermal isolator 144. The thermal isolator 144 insulates the electrostatic chuck 142 from a stem 172 that supports the electrostatic chuck 142 above the bottom of the lower chamber body 102.

Lift pins 146 are disposed through the substrate support assembly 140. A lift plate 148 is disposed below the substrate support assembly 140 and may be actuated by a lift 154 to selectively displace the lift pins 146 to lift and/or place a substrate 150 on an upper surface 152 of the electrostatic chuck 142.

The electrostatic chuck 142 includes at least one electrode (not shown) which may be energized to electrostatically retain the substrate 150 to the upper surface 152 of the electrostatic chuck 142. An electrode of the electrostatic chuck 142 is coupled to a bias power source 156 through a matching circuit 158. The bias power source 156 may selectively energize the electrode of the electrostatic chuck 142 to control the directionality of the ions during etching.

The bias power applied to the electrostatic chuck 142 by the bias power source 156 may be pulsed, e.g. repeatedly storing or collecting the energy over a time period and then rapidly releasing the energy over another time period to deliver an increased instantaneous amount of power, while the source power may be continuously applied. In particular, the bias power may be pulsed using generator pulsing capability set by a control system to provide a percentage of time that the power is on, which is referred to as the "duty cycle." In one embodiment, the time on and the time off of a pulsed bias power may be uniform throughout the etching cycles. For example, if the power is on for about 3 msec and off for about 15 msec, then the duty cycle would be about 16.67%. The pulsing frequency in cycles per second or hertz (Hz) is equal to 1.0 divided by the sum of the on and off time periods in seconds. For example, when the bias power is on for about 3 msec and off for about 15 msec, for a total of about 18 msec, then the pulsing frequency in cycles per second is about 55.55 Hz. In one embodiment, a specialized pulsing profile where the on/off timing changes during the etching cycles may be used. In one embodiment, by changing the bias power applied to the substrate, the etching cycle may switch between the deposition and/or etching steps. The bias power is pulsed to help reduce scalloping of the trench sidewalls, improve resist selectivity, improve the etch rate, and prevent material interface undercut.

Figure 2:
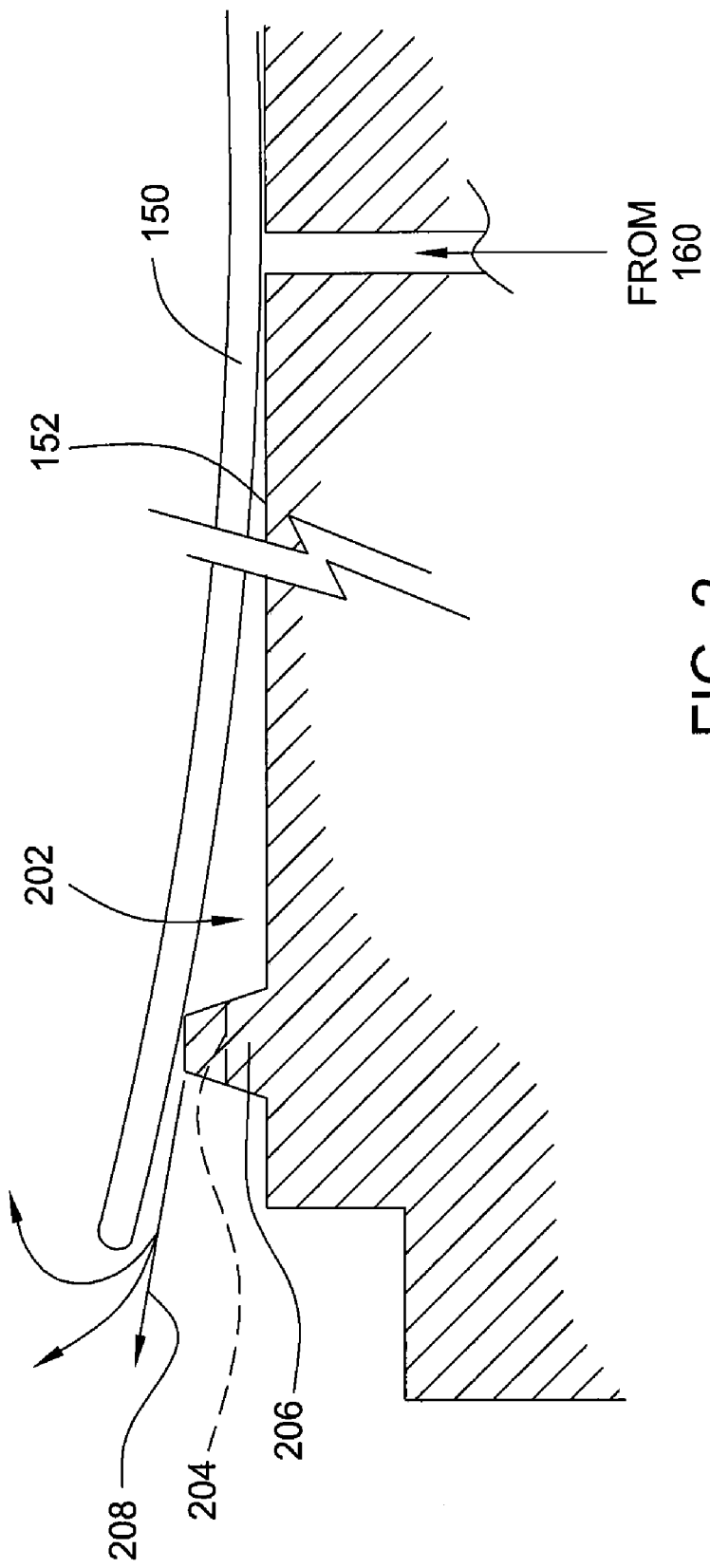
FIG. 2 is a partial sectional schematic of one embodiment of a substrate support assembly.

Referring additionally to FIG. 2, a backside gas source 160 is coupled through the substrate support assembly 140 to provide one or more gases to a space 202 defined between the substrate 150 and the upper surface 152 of the electrostatic chuck 142. Gases provided by the backside gas source 160 may include He and/or a backside process gas. The backside process gas is a gas delivered from between the substrate and the substrate support which effects the rate of etch or polymerization during the etch cycle by reacting with the materials in the chamber, such as process gases, etch by-products, mask or other layers disposed on the substrate or the material targeted for etching. In one embodiment, the backside process gas is an oxygen containing gas, such as $O_2$. In one embodiment, a ratio of He to $O_2$ in the backside gas is about 50:50 to about 70:30 by volume or by mass for silicon etch applications. It is contemplated that other backside process gases may be utilized to control the processes near the edge of the substrate. It is contemplated that the use of backside process gases may be used beneficially for single step etch processes as well as cyclical etch processes as described below.

To enable the process gas provided by the backside gas source 160 to reach the edge of the substrate 150, the rate of backside gas leakage from under the edge of the substrate 150 is higher than that of conventional backside gas systems. In one embodiment, the leak rate is elevated by maintaining the pressure of the gases in the space 202 between the substrate 150 and the upper surface 152 of the electrostatic chuck 142 between about 4 and 26 Torr. In another embodiment, the pressure is maintained between about 10 and 22 Torr. In still another embodiment, the pressure is maintained between about 14 and 20 Torr. It is contemplated that the leak rate (shown by arrows 208) may also be achieved by providing notches (204 shown in phantom) or other features in a lip 206 supporting the substrate 150 and the upper surface 152 of the electrostatic chuck 142 which promotes leakage of the backside gas between the electrostatic chuck 142 and the substrate 150.

Figure 3:
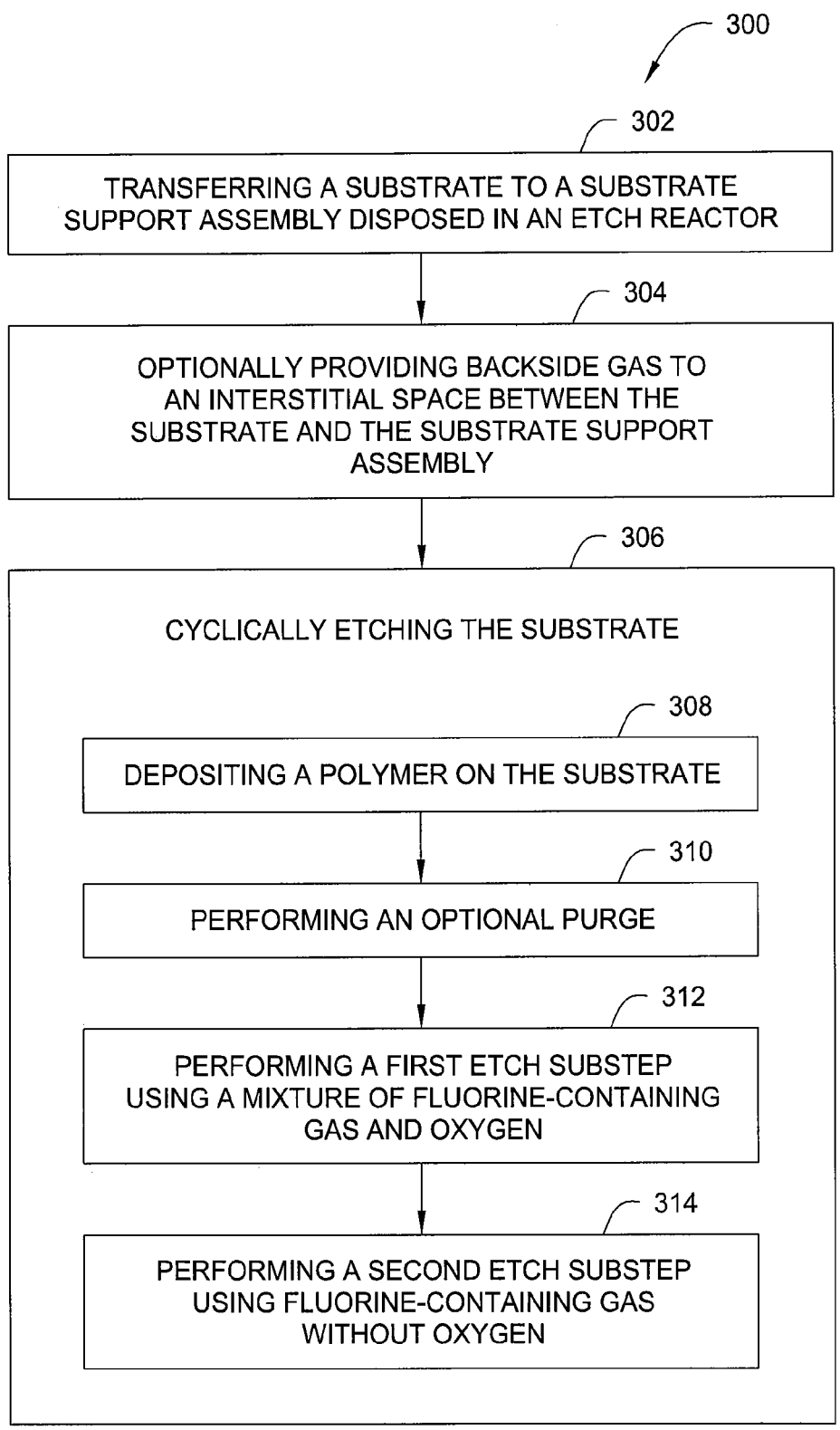
FIG. 3 is a flow diagram of one embodiment of an etching process.

FIG. 3 depicts a flow diagram of one embodiment of a method 300 for etching a substrate. The method 300 may be practiced in the etch reactor 100 or other suitable etch reactor. The method 300 begins at step 302 by transferring a substrate to a substrate support assembly 140 disposed in the reactor 100.

At an optional step 304, backside gas is provided to the interstitial space between the substrate and the substrate support assembly. In one embodiment, the backside gas contains a backside process gas. The backside gas contains may also contain He or other inert gas. The backside process gas, when used during all or a portion of the cyclical etching process at 306, affects at least one of the etching or deposition substep described further below.

In one embodiment, the backside process gas includes a polymer forming gas. In one embodiment, the polymer forming gas is an oxygen-containing gas, such as $O_2$. Helium or other inert gas may be present in the backside gas. In one embodiment, the ratio of helium to backside process gas in the backside gas is between about 50:50 and about 70:30 by weight or mass. The pressure of backside gas is provided in a range of about 4 and 26 Torr or other pressure suitable to ensure a sufficient leakage of backside gas from below the edge of the wafer such that the backside process gas affects processing on the substrate's surface.

At step 306, a cyclical etching process is performed. The cyclical etching process includes at least one deposition substep and at least one etch substep. The substeps are repeatedly performed until an endpoint is reached. The endpoint may be determined through time, effluent monitoring, plasma monitoring, thickness monitoring or other suitable endpoint detection method. In one embodiment, the cyclical etching process performed at step 306 includes a polymer deposition substep 308, an optional purge substep 310, a first etch substep 312 and a second etch substep 314. The substrate temperature may be maintained between about (−)10 to about (+)10 degrees Celsius, for example, at about (+)10 degrees Celsius, during the cyclical etching process of step 306.

The polymer deposition substep 308 may include providing a polymer-forming gas through the fast gas manifold. The polymer-forming gas may include a carbon-containing gas such as $C_4F_8$, among others. During the polymer deposition substep 308, $C_4F_8$ may be provided into the process volume 108 of the etch reactor 100 at a rate of between about 100 to about 500 sccm, for example, between about 150 to about 450 sccm, while maintaining chamber pressure at about 60 to about 120 milliTorr, for example, about 85 milliTorr. RF power may be applied to the coil 112 to maintain a plasma formed from the polymer-forming gas. In one embodiment, the RF power applied to the coil 112 is about 1000 to about 2500 Watts, for example, between about 1500 to about 2100 Watts. RF bias power may be applied to the electrode of the electrostatic chuck 142 to promote deposition. In one embodiment, the RF bias power provided by the bias power source 156 to the electrode of the electrostatic chuck 142 is about 1 to about 500 Watts, for example, between about 70 to about 350 Watts. The RF bias power may be pulsed or applied as continuous duty. The duration of the substep 308 is about 1.0 to about 5.0 seconds, for example, about 1.0 to about 3.0 seconds.

The deposition substep 308 provides good sidewall polymer coverage which assists minimizing scalloping during the cylindrical etch cycle.

The purge substep 310 is optionally performed between the deposition substep 308 and the second etch substep 314. During the purge substep 310, the throttle valve is opened to enhance the pumping of gases remaining in the process volume 108 from the deposition substep 308. This generally causes the pressure within the process volume to drop. The duration of the purge substep 310 may be less than about 1.0 seconds or as desired. In one embodiment, no RF plasma or bias power is applied during the purge substep 310.

In one embodiment, the purge substep 310 may include providing He and/or $HeO_2$ to the process volume 108. RF power is applied to the coil 112 to maintain a plasma formed from the He and/or $HeO_2$ gas. In one embodiment, the RF power applied to the coil 112 is about 1000 to about 2500 Watts, for example, between about 1500 to about 2100 Watts. RF bias power may be applied to the electrode of the electrostatic chuck 142 to promote removal of the polymer from the bottom of the cyclically etch feature during the purge substep 310 to speed the subsequent etching substeps. In one embodiment, the RF bias power provided by the bias power source 156 is about 1 to about 500 Watts, for example, between about 70 to about 350 Watts. The RF bias power may be pulsed or applied as continuous duty.

The first etch substep 312 generally provides a short isotropic etch to preferentially etch polymer from the bottom, horizontal surfaces of the feature being etched to expose silicon material for subsequent anisotropic etching during the second etch substep 314. The first etch substep 312 includes providing a mixture of a fluorine-containing gas and oxygen to the process volume 108. Suitable fluorine-containing gases include $SF_6$, $NF_3$, $CF_4$, $CHF_3$, $ClF_3$, $BrF_3$, $IF_3$, or derivatives thereof. The gas mixture provided during the first etch substep 312 may include other gases, such as He and/or $HeO_2$.

In one embodiment, the gas mixture provided during the first etch substep 312 may include about 100 to about 500 sccm of $SF_6$, less than 20 sccm of $O_2$. Optionally the gas mixture may include about 0 to about 200 sccm of He. Optionally, the gas mixture may include about 0 to about 100 sccm of $HeO_2$ The pressure of the gas mixture within the process volume 108 is maintain at about 25 to about 85 milliTorr. About 1000 to about 2500 Watts of RF power is provided to the coil 112 to maintain a plasma formed from the gas mixture. About 1 to about 500 Watts of RF bias power (continuous or pulsed) is provided to the electrode of the electrostatic chuck 142. The first etch substep 312 may have a duration of about 0.5 to about 5.0 seconds.

In another embodiment, the first etch substep 312 includes providing about 150 to about 450 sccm of $SF_6$ and about 5 to about 10 sccm of $O_2$. Optionally the gas mixture may include about 50 to about 150 sccm of He. Optionally, the gas mixture may include about 50 to about 75 sccm of $HeO_2$ The pressure of the gas mixture within the process volume 108 is maintain at about 35 to about 65 milliTorr. About 1500 to about 2100 Watts of RF power is provided to the coil 112 to maintain a plasma formed from the gas mixture. About 70 to about 350 Watts of RF bias power (continuous or pulsed) is provided to the electrode of the electrostatic chuck 142. The first etch substep 312 may have a duration of about 1.0 to about 4.0 seconds.

In one embodiment, the low pressure and high bias power utilized during the first etch substep 312 relative to the second etch substep 314 generates high directional ion bombardment. The directional ion bombardment, coupled with the gas mixture, enhances polymer removal at the bottom of the trench (feature being etched) without adversely affecting sidewall polymer coverage.

Following the first etch substep 312, the second etch substep 314 is performed. The second etch substep 314 includes providing an oxygen-free fluorine-containing gas to the process volume 108. Oxygen-containing gases are not mixed with the fluorine-containing gas. Suitable fluorine-containing gases include $SF_6$, $NF_3$, $CF_4$, $CHF_3$, $ClF_3$, $BrF_3$, $IF_3$, or derivatives thereof. He may optionally be provided during the second etch substep 314. Experiments have indicated that sidewall pitting may occur if oxygen is added during the second etch substep 314, which is believed to be caused by an attack by $O_2$ on the polymers which protect the sidewall. Additionally, by having an oxygen-free second etch substep 314, any residual oxygen in the process volume 108 introduced during other steps/substeps to the process volume 108 is well purged, thereby preventing $O_2$ from mixing with the $C_4F_8$ provided during the subsequent deposition substep 308 and weakening it's passivation ability.

In one embodiment, about 100 to about 500 sccm of $SF_6$ is provided during the second etch substep 314. The pressure of the gas within the process volume 108 may be different than that used during the first etch substep 312. For example, the pressure of the gas within the process volume 108 may be maintain at about 35 to about 85 milliTorr during the second etch substep 314. About 1000 to about 2500 Watts of RF power is provided to the coil 112 to maintain a plasma formed from the $SF_6$ gas. About 1 to about 500 Watts of RF bias power (continuous or pulsed) is provided to the electrode of the electrostatic chuck 142. The second etch substep 314 may have a duration of about 0.5 to about 15.0 seconds.

In one embodiment, the pressure of the second etch substep 314 is increased relative to the pressure utilized during the first etch substep 312 while the bias power is reduced to provide higher fluorine radical density. The relatively higher pressure with low bias power provides a chemically driven, low bias process that maintains sidewall integrity with improved resist selectivity.

In another embodiment, the second etch substep 314 includes providing about 150 to about 450 sccm of $SF_6$ to the process volume 108. The pressure within the process volume 108 may be maintained at about 35 to about 110 milliTorr. About 1500 to about 2100 Watts of RF power is provided to the coil 112 to maintain a plasma formed from the $SF_6$ gas. About 70 to about 350 Watts of RF bias power (continuous or pulsed) is provided to the electrode of the electrostatic chuck 142. The second etch substep 314 may have a duration of about 1.0 to about 12.0 seconds.

Rapid switching between substeps 308, 310, 312 and 314 and back is augmented by the use of mass flow controller in the fast gas exchange system 124 having response times in the range of 300 ms. Faster switching between substeps 308, 310, 312 and 314 results in faster etch rates and less scalloping of the feature sidewalls.

While the foregoing is directed to embodiments of the invention, other and further embodiments of the invention may be devised without departing from the basic scope thereof, and the scope thereof is determined by the claims that follow.

What is claimed is:

1. A method for etching a substrate in a plasma etch reactor comprising:
    a) depositing a polymer on a substrate in an etch reactor;
    b) etching the substrate using a gas mixture including a fluorine-containing gas and oxygen in the etch reactor, wherein the gas mixture includes less than 20 sccm of oxygen;
    c) etching a silicon-containing layer disposed on the substrate using a fluorine-containing gas without mixing oxygen in the etch reactor; and
    d) repeating a), b) and c) until an endpoint of a feature etched into the silicon-containing layer is reached.

2. The method of claim 1, wherein b) further comprises: etching the substrate in the presence of at least one of He or $HeO_2$.

3. The method of claim 1, wherein b) is performed at a lower pressure than c).

4. The method of claim 1, wherein b) is performed using a higher bias power than c).

5. The method of claim 1, wherein c) further comprises: forming a plasma from $SF_6$.

6. The method of claim 1, wherein b) further comprises: forming a plasma from $SF_6$ and $O_2$.

7. The method of claim 1, wherein b) further comprises: forming a plasma from a gas mixture of $SF_6$ and $O_2$ and at least one of He and $HeO_2$; and wherein c) further comprises: forming a plasma from $SF_6$.

8. The method of claim 1, wherein b) further comprises: etching the substrate in the presence of $HeO_2$.

9. The method of claim 1 further comprising:
    flowing a backside process gas out from between an edge of the substrate and a substrate assembly and into the plasma etch reactor, wherein the backside process gas is a gas which affects the rate of etch or polymerization during d) by reacting with materials in the plasma etch reactor.

10. The method of claim 9, wherein the backside process gas includes at least oxygen.

11. The method of claim 1 further comprising:
    purging the etch reactor between a) and b).

12. The method of claim 11, wherein purging further comprises:
    flowing at least one of He or $HeO_2$ into the etch reactor.

13. The method of claim 11, wherein purging further comprises:
    forming a plasma from at least one of He or $HeO_2$ in the etch reactor.

14. The method of claim 13, wherein purging further comprises:
    biasing the substrate with RF power.

15. A method for etching a substrate in a plasma etch reactor comprising:

a) depositing a polymer on silicon-containing layer disposed on a substrate in an etch reactor;
b) isotropically etching the polymer and silicon-containing layer in the etch reactor using a gas mixture including a fluorine-containing gas and oxygen maintained at a first pressure, wherein the gas mixture includes less than 20 sccm of oxygen;
c) anisotropically etching the silicon-containing layer in the etch reactor using a fluorine-containing gas without mixing oxygen maintained a second pressure that is greater than the first pressure, wherein the fluorine-containing gas comprising the gas mixture is selected from the group consisting of $SF_6$, $NF_3$, $CF_4$, $CHF_3$, $ClF_3$, $BrF_3$, $IF_3$ and derivatives thereof; and
d) repeating a), b) and c) until an endpoint of a feature etched into the silicon-containing layer is reached.

16. The method of claim 15 further comprising:
purging the etch reactor between a) and b) with at least one of He or $HeO_2$.

17. The method of claim 16, wherein purging further comprises:
forming a plasma from at least one of He or $HeO_2$ in the etch reactor during purging; and
biasing the substrate during purging.

18. The method of claim 15 further comprising:
flowing a backside process gas out from between an edge of the substrate and a substrate assembly and into the plasma etch reactor, wherein the backside process gas is a gas which affects the rate of etch or polymerization during d) by reacting with materials in the plasma etch reactor.

19. The method of claim 18, wherein the backside process gas comprises at least oxygen.

20. The method of claim 19, wherein the backside process gas further comprises helium, wherein the ratio of helium to oxygen is between about 50:50 and about 70:30 by weight or mass.

* * * * *